US006765202B1

(12) United States Patent
Hohn

(10) Patent No.: US 6,765,202 B1
(45) Date of Patent: Jul. 20, 2004

(54) MICROSCOPE HAVING AN ELECTRON BEAM FOR ILLUMINATION

(75) Inventor: Fritz Juergen Hohn, Herborn (DE)

(73) Assignee: Leica Microsystems Wetzler GmbH, Wetzlar (DE)

( * ) Notice: Subject to any disclaimer, the term of this patent is extended or adjusted under 35 U.S.C. 154(b) by 259 days.

(21) Appl. No.: 09/783,308

(22) Filed: Feb. 15, 2001

(30) Foreign Application Priority Data

Feb. 19, 2000 (DE) .......................................... 100 07 650

(51) Int. Cl.⁷ ............................................. H01J 35/252
(52) U.S. Cl. ..................... 250/310; 250/311; 250/306; 250/397; 250/398; 250/396 R
(58) Field of Search ................................. 250/310, 311, 250/397, 398, 306, 396 R

(56) References Cited

U.S. PATENT DOCUMENTS

| | | | | |
|---|---|---|---|---|
| 3,624,391 A | * | 11/1971 | Saffron | |
| 3,634,689 A | * | 1/1972 | Djiri et al. | |
| 4,823,006 A | * | 4/1989 | Danilatos et al. | 250/310 |
| 5,254,856 A | * | 10/1993 | Matsui et al. | 250/310 |
| 5,396,067 A | * | 3/1995 | Suzuki et al. | 250/310 |
| 5,442,183 A | * | 8/1995 | Matsui et al. | 250/396 R |
| 5,481,401 A | * | 1/1996 | Kita et al. | 359/353 |
| 5,485,008 A | * | 1/1996 | Taylor | 250/310 |
| 5,828,064 A | | 10/1998 | Knowles | 250/310 |

OTHER PUBLICATIONS

Chang et al., "Electron Beam Technology—SEM To Microcolumn", *Microelectronic Engineering*, Elsevier Science B.V., vol. 32:113–130, (1996).

* cited by examiner

*Primary Examiner*—Nikita Wells
(74) *Attorney, Agent, or Firm*—Foley & Lardner LLP

(57) ABSTRACT

The microscope (2) is substantially similar to the configuration of a conventional microscope. The microscope (2) comprises a foot element (4) on which a column (6) sits. An arm (8) is mounted or shaped onto the column (6). Located in the vicinity of the front end (10) of the arm (8) is an optical unit (12) that defines an optical axis (16). One or more of the objectives (18) or (22) mounted on the revolving nosepiece (20) are configured as so-called "objectives for scanning electron microscopy" (electron beam objectives). The size of the electron beam objectives is comparable to the size of objectives for conventional microsopes. Because the objectives (18) and (22) are arranged on a revolving nosepiece (20), on a slider, or on another mechanical and/or electromechanical component, it a quick and easy matter to change among different magnifications or illumination types.

14 Claims, 3 Drawing Sheets

MICROSCOPE HAVING AN ELECTRON BEAM FOR ILLUMINATION

CROSS REFERENCE TO RELATED APPLICATIONS

This invention claims priority of a German patent application DE 100 07 650.5-33 which is incorporated by reference herein.

1. Field of the Invention

The invention concerns a microscope having an electron beam for illumination. In particular, the invention concerns an electron microscope that is similar in its configuration to a conventional microscope. The objectives are arranged on a revolving nosepiece so that the objective having the desired magnification can be pivoted into the beam path.

2. Background of the Invention

The article entitled "Electron beam microcolumn" by T. H. P. Chang et al. which appeared in Microelectronic Engineering 32 (1996), pp. 113–130, underlines the importance of scanning electron microscopy at low voltages. Applications exist in surface inspection, metrology, and lithography. Electron-optical columns are manufactured using the micropatterning technique, and are multiple-layer systems made up of layers having different electrical properties. The electron-optical columns produced in this fashion are operated at a voltage of approx. 1 keV.

Scanning electron microscopy is known and extensively developed. The resolution of scanning electron microscopy exceeds the resolution of optical systems by several orders of magnitude: a resolution of a few nanometers can easily be achieved with it. U.S. Pat. No. 5,828,064 discloses an electron microscope with which samples can be examined in a chamber provided especially for the purpose. The gas pressure in the chamber is kept at between $10^{-2}$ and 50 torr. The configuration of the electron microscope comprises at least four different vacuum zones that create a pressure difference of $10^{-10}$ torr between the electron gun and the sample chamber. The various pressure regions are created in the electron-optical column that is placed on the sample chamber. A rapid and convenient change in magnification is not, however, possible with this system. In addition, the configuration of a scanning electron microscope of this kind is large, expensive, and difficult to manipulate.

SUMMARY OF THE INVENTION

It is the object of the present invention to create a microscope that achieves the resolution of conventional scanning electron microscopes and possesses an economical configuration. The microscope should differ very little from the overall size of conventional light microscopes.

This object is achieved by a microscope which is characterized in that at least one objective that can be arranged in the optical axis is configured as an electron beam objective.

One advantage of the invention is that in one specific embodiment, the samples can be examined under standard environmental conditions. The electron beam objectives used are comparable, in terms of their size, to the objectives of conventional light microscopes. This miniaturization is made possible by advances in micropatterning technology, and in this case in particular by silicon processing technologies. A further advantage of the invention is that electrostatic charging of the samples is avoided. This is due on the one hand to the fact that the electron beam is generated in the electron beam objectives using low acceleration voltages (on the order of 1 keV). On the other hand, ambient air is ionized at the transition from the electron beam objective to the sample, thus making it possible to dissipate the charge. A microscope according to the invention can be configured in particularly versatile fashion. For example, the electron beam objectives can be mounted on a revolving nosepiece, allowing a rapid changeover between different magnifications. Moreover, an optical objective can be provided in addition to the electron beam objectives, making possible, in the working position, purely optical observation of the sample at a lower resolution. Since the microscope can also be used for purely optical imaging, an optical unit which defines an optical axis is provided. An electron beam objective can be arranged in alignment with the optical axis, e.g. can be introduced by way of the revolving nosepiece into the optical axis and into the so-called working position. In the working position, the electron beam objective, comprising an electron microscope column, is arranged symmetrically about the optical axis. For many applications, it is particularly advantageous if the electron beam objective is spaced slightly away from the surface of a sample being examined. The samples can thus be examined under standard environmental conditions, thereby eliminating any complex preparation or even damage. The electron beam objective can thus be arranged in such a way that standard air pressure is present between the sample and the electron beam objective. In one possible configuration of an electron beam objective, it comprises a first housing that encloses a second housing. The electron microscope column is arranged in the second housing, symmetrically about the optical axis. Also provided are appropriate vacuum devices which maintain in the first housing a lower air pressure than in the external environment. In the second housing, a vacuum is created that is even more greatly improved as compared to the first housing.

BRIEF DESCRIPTION OF THE DRAWINGS

The drawings schematically depict the subject matter of the invention, which is described below with reference to the Figures, in which.

DETAILED DESCRIPTION OF THE INVENTION

Figure 1:
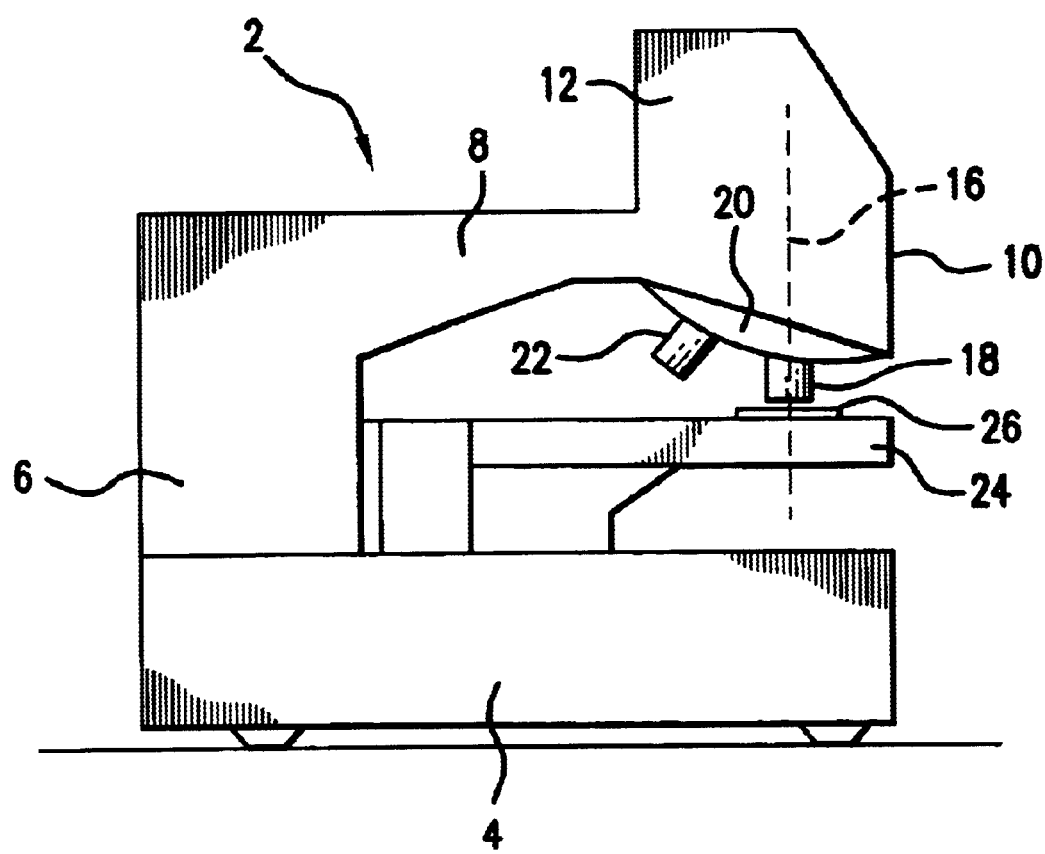
FIG. 1 shows a schematic view of the apparatus according to the present invention.

FIG. 1 shows the schematic configuration of apparatus 2 according to the present invention. Microscope 2 is substantially similar to the configuration. of a conventional microscope. Microscope 2 comprises a foot element 4 on which a column 6 sits. An arm 8 is mounted or shaped onto column 6. Arm 8 has an end 10 facing away from column 6. Located in the vicinity of front end 10 of arm 8 is an optical unit 12 that substantially comprises optical elements (not depicted) which define an optical axis 16 (depicted with dashes in FIG.

1). An objective 18, which defines the desired magnification for microscope 2, is provided in optical axis 16. To make it easier to select among different magnifications, a revolving nosepiece 20 is provided which carries at least one further objective 22 in addition to objective 18 that is already present. The configuration and individual components of a conventional microscope need not be discussed here in further detail, since they are sufficiently familiar to one skilled in the art. One or more of objectives 18 or 22 mounted on revolving nosepiece 20 are configured as so-called micro-objectives for scanning electron microscopy (hereinafter referred to as "electron beam objectives"). The size of the electron beam objectives is comparable to the size of the objectives of conventional microscopes. The electron beam objectives are configured as electron microscope columns, which are comparable to the configuration of conventional macroscopic columns for scanning electron microscopy. Because objectives 18 and 22 are arranged on a revolving nosepiece 20, on a slider, or on another mechanical and/or electromechanical component, it a quick and easy matter to change among the different magnifications, or switch over from conventional optical imaging to electron microscope imaging. Various embodiments of the objective configuration are described more exactly in FIGS. 2 and 3. Also provided on foot 4 of the microscope is a stage 24 with which a sample 26 being examined can be brought into the correct position relative to objective 18 or 22.

A further embodiment of the present invention is to use microscope 2 exclusively as an electron microscope. For that purpose, all the objectives are configured as electron microscope columns. The electron beam objectives are individually connected to a vacuum device (not depicted) that generates the appropriate vacuum for electron beam propagation in the electron beam objective.

Figure 2:
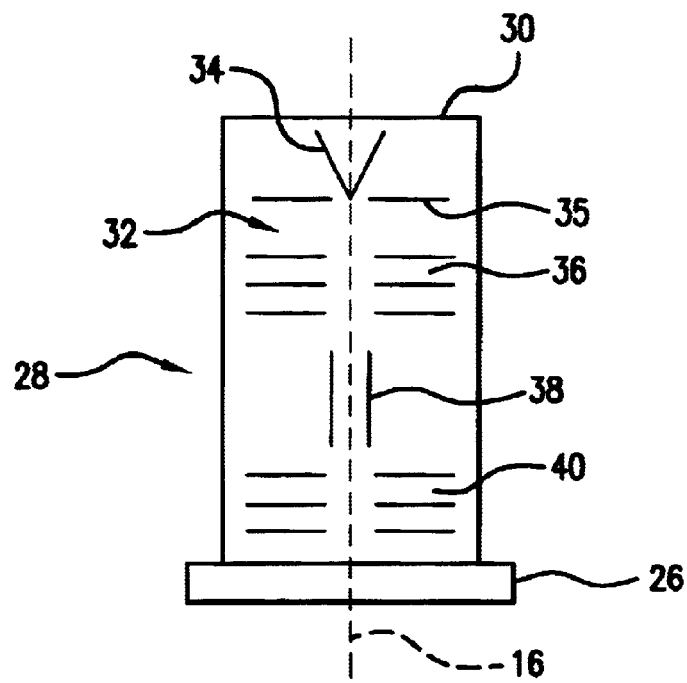
FIG. 2 shows an embodiment of an electron beam objective and its position with respect to the sample being examined.

FIG. 2 shows a first embodiment of an electron beam objective 28. Electron beam objective 28 comprises a housing 30 in which an electron microscope column 32 is provided in microscopic form. The vacuum system (not depicted) for electron beam objective 28 is integrated, for example, into revolving nosepiece 20 of microscope 2. The configuration of electron microscope column 32 is symmetrical about optical axis 16 defined by optical unit 12 of microscope 2. An electron emitter 34 having a stop 35 is provided in the upper portion of housing 30. A first electron-optical lens 36 is mounted after stop 35. Arranged after electron-optical lens 36 is a deflection element 38 which is followed by an electron-optical objective lens 40. Housing 30 of electron beam objective 28 forms a hermetic unit with sample 26 being examined. This can be achieved by the fact that electron beam objective 28 sits directly on sample 26, and thus seals off the region being examined from ambient air. Another possibility is for sample 26 to be introduced into electron beam objective 28 and thus sealed off from ambient air. It is self-evident that electron beam objective 28 is connected to an electronic control system (not depicted) in order to deflect or shape the electron beam. The electronic control system is comparable to the electronic control system of conventional electron microscope columns, and is sufficiently familiar to one skilled in the art that it need not be discussed further in this connection.

In conventional microscopes, objective changes occur in ambient air. A second embodiment (FIG. 3) shows an electron beam objective 42 that is used in the examination of samples under standard environmental conditions (approximately ambient air pressure). Electron beam objective 42 comprises a first housing 44 that has a connection 45 to a first vacuum device (not depicted). First housing 44 moreover possesses an exit opening 46 for the electron beam. Exit opening 46 is also arranged symmetrically about optical axis 16. A second housing 48 encloses electron microscope column 32. Second housing 48 is enclosed by first housing 44. Second housing 48 has a second connection 49 to a further vacuum device (not depicted). For that purpose, a corresponding opening 50 is shaped into the first housing in order to provide passage for second connection 49. The further vacuum device is configured, for example, as a high-vacuum system. The vacuum systems generate in second housing 48 a pressure which is lower than the pressure generated by the vacuum device in first housing 44. A pressure difference thus exists upon transitioning from the second to the first housing, and upon transitioning from the first housing to ambient air.

Second housing 48 moreover also possesses an exit opening 52 for the electron beam which aligns with exit opening 46 in first housing 44. As already explained in FIG. 2, electron microscope column 32 is provided in second housing 48. The configuration of electron microscope column 32 is symmetrical about optical axis 16 defined by optical unit 12 of microscope 2. An electron emitter 34 with a stop 35 is provided in the upper part of second housing 48. A first electron-optical lens 36 is provided after stop 35. Arranged after electron-optical lens 36 is a deflection element 38, which is followed by an electron-optical objective lens 40. Electron beam objective 42 is arranged with respect to sample 26 being examined in such a way that ambient air pressure is present between sample 26 and opening 46 of first housing 44. The distance between sample 26 and opening 46 should be very small. Distances of approximately 0.1 mm have proven useful.

Electron beam objective 42 can moreover be made up of more than two housings. As already mentioned above, a different pressure is then generated n each of the housings that is present, in such a way that a pressure gradient exists upon transitioning from one housing to another, or to ambient air. It is always the case that the innermost housing has the lowest pressure, and the pressure becomes greater in stages toward the housings located farther out.

Figure 4:
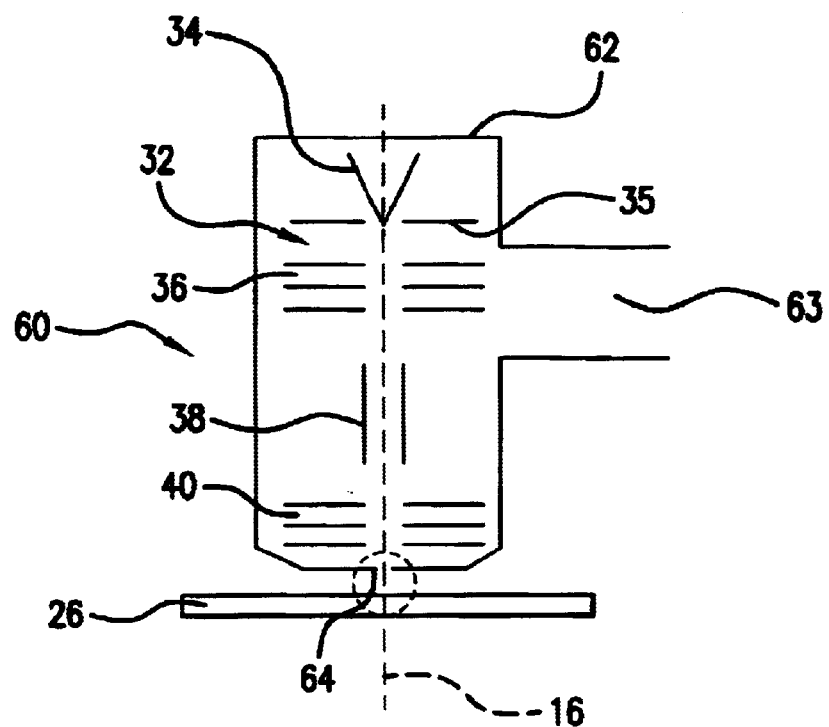
FIG. 4 shows a third embodiment of an electron beam objective and its position with respect to the sample being examined.
Figure 5:
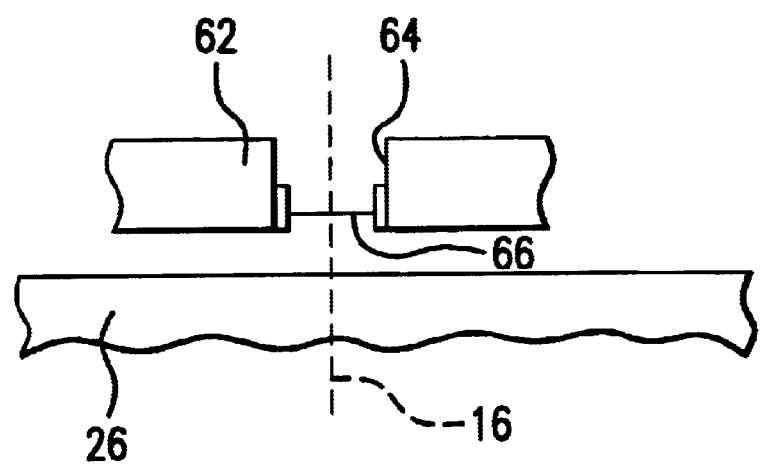
FIG. 5 shows an enlarged depiction of the region enclosed in a dashed circle in FIG. 4.

A third embodiment of an electron beam objective 60 is described in FIG. 4. Electron beam objective 60 comprises a housing 62 which discloses [sic] a connection 63 to a vacuum device (not depicted). An electron microscope column 32 is configured in the interior of housing 62. The configuration of electron microscope column 32 is symmetrical about optical axis 16 defined by optical unit 12 of microscope 2. An electron emitter 34 with a stop 35 is provided in the upper portion of housing 60. A first electron-optical lens 36 is provided after stop 35. Arranged after electron-optical lens 36 is a deflection element 38, which is followed by an electron-optical objective lens 40. Electron beam objective 60 once again defines an opening 64 that is arranged symmetrically about optical axis 16. Opening 64 is sealed off hermetically with a membrane 66 (see FIG. 5). Membrane 66 is configured in such a way that it is transparent to the electron beam. Electron beam objective 60 is arranged with respect to sample 26 being examined in such a way that ambient air pressure exists between sample 26 and membrane 66 in opening 64 of housing 62. The distance between sample 26 and electron beam objective 60 is preferably approximately 0.1 mm or less.

Figure 3:
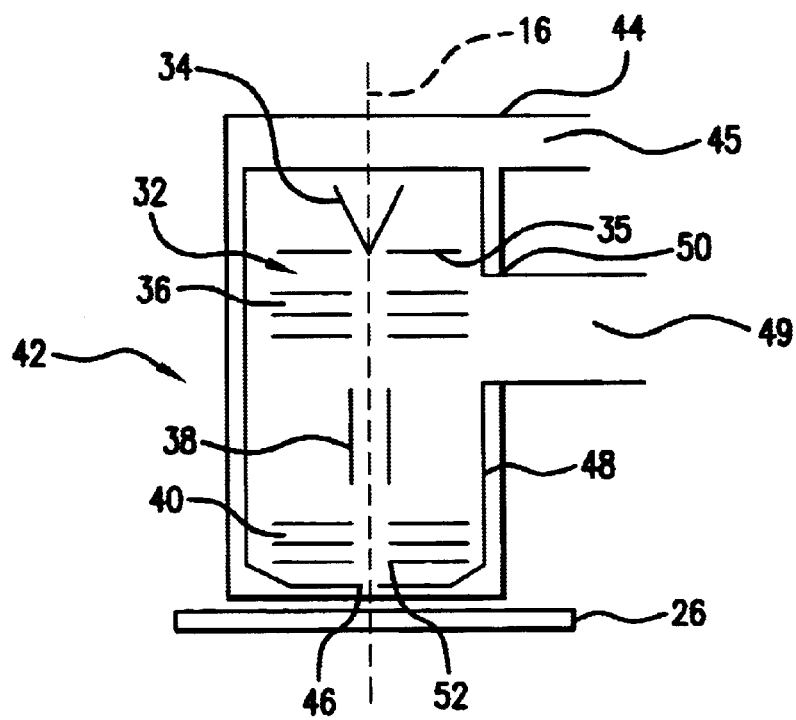
FIG. 3 shows a further embodiment of an electron beam objective and its position with respect to the sample being examined.

The embodiments of electron beam objectives 28, 42, and 60 described in FIGS. 2, 3, and 4 possess a length of approx. 2 cm. The micropatterning technique is utilized for the production of electron beam objectives 28, 42, and 60. The corresponding patterns are fabricated, for example, from silicon.

The invention has been described with reference to particular embodiments. It is self-evident, however, that one skilled in the art can made changes and modifications without thereby leaving the range of protection of the claims recited below.

PARTS LIST

2 Apparatus
4 Foot element
6 Column
8 Arm
10 End facing away from column
12 Optical unit
16 Optical axis
18 Objective
20 Revolving nosepiece
22 Further objective
24 Stage
26 Sample
28 Electron beam objective
30 Housing
32 Electron microscope column
34 Electron emitter
35 Stop
36 Electron-optical lens
38 Deflection element
40 Electron-optical objective lens
42 Electron beam objective
44 First housing
45 First connection
46 Exit opening
48 Second housing
49 Second connection
50 Opening
52 Exit opening
60 Electron beam objective
62 Housing
63 Connection
64 Opening
66 Membrane

What is claimed is:

1. A microscope (2) having a configuration of a conventional microscope, comprising:

an optical unit (12) defining an optical axis; and
at least one objective (22) that can be arranged in the optical axis (16) and is configured as an electron beam objective (28, 42),
said electron beam objective having a size comparable to an objective of a conventional light microscope.

2. The microscope (2) as defined in claim 1, comprising:
multiple objectives (18, 22) arranged on a revolving nosepiece (20), at least one objective (22) being configured as an electron beam objective (28, 42).

3. The microscope (2) as defined in claim 1, comprising:
an electron beam objective (28, 42) comprising an electron microscope column (32) which is arranged in a housing (30) symmetrically about the optical axis (16).

4. The microscope (2) as defined in claim 3, comprising:
an electron beam objective (28) forming a hermetic unit with a sample (26) being examined.

5. The microscope (2) as defined in claim 1, comprising:
the electron beam objective (42) being spaced slightly away from the surface of a sample (26) being examined whereby approximately ambient air pressure exists between the electron beam objective (42) and the sample (26).

6. The microscope (2) as defined in claim 5, comprising:
a single housing (62) of the electron beam objective comprising an opening (64) for the electron beam, said opening (64) being sealed hermetically with a membrane (66) that is transparent to electron beams.

7. A microscope (2) with an optical unit (12) defining an optical axis, comprising:

at least one objective (22) that can be arranged in the optical axis (16) and is configured as an electron beam objective (28, 42),
the electron beam objective (42) being spaced slightly away from the surface of a sample (26) being examined whereby approximately ambient air pressure exists between the electron beam objective (42) and the sample (26), and
the electron beam objective (42) comprising a first housing (44) that encloses a second housing (48), whereby an electron microscope column (32) is arranged in the second housing (48) symmetrically about the optical axis (16), and whereby a higher air pressure is existing in the first housing (44) than in the second housing (48).

8. The microscope (2) as defined in claim 7, comprising:
a first vacuum device,
a first connection (45) between the first housing (44) and said first vacuum device,
a further vacuum unit,
and a second connection (49) between the second housing (48) and said further vacuum unit.

9. The microscope (2) as defined in claim 7, comprising:
a first opening (46) of the first housing (44) for transmitting the electron beam, and
a second opening (52) of the second housing (48) for transmitting the electron beam,
said first opening (46) and said second opening (52) being arranged symmetrically about the optical axis (16).

10. A microscope comprising:

an optical unit defining an optical axis;
a revolveable nosepiece connected to the optical unit and configured to support a plurality of objectives and to arrange at least one of said objectives in the optical axis; and
an electron beam objective supported by the nosepiece; and, said electron beam objective having a size comparable to an objective of a conventional light microscope.

11. The microscope as in claim 10, further comprising a light objective supported by the nosepiece.

12. An electron beam objective comprising:

a first housing;
a second housing enclosed by the first housing;
an electron microscope column arranged in the second housing symmetrically about an optical axis,
wherein the electron beam objective is configured so that the second housing has a second pressure lower than a first pressure of the first housing; and, said electron beam objective having a size comparable to an objective of a conventional light microscope.

13. The microscope as in claim 12, wherein the first pressure is less than ambient air pressure.

14. A microscope comprising:
- a foot element;
- a column connected to the foot element;
- an arm connected at one end to the column;
- an optical unit connected to an opposite end of the arm, wherein the foot element, column, arm, and optical unit have a configuration of a conventional microscope, and wherein the optical unit defines an optical axis; and
- at least one objective that can be arranged in the optical axis and is configured as an electron beam objective, said electron beam objective having a size comparable to an objective of a conventional light microscope.

* * * * *